United States Patent [19]

Gerlach et al.

[11] Patent Number: 5,032,724
[45] Date of Patent: Jul. 16, 1991

[54] MULTICHANNEL CHARGED-PARTICLE ANALYZER

[75] Inventors: Robert L. Gerlach; Ronald E. Negri, both of Minnetonka, Minn.

[73] Assignee: The Perkin-Elmer Corporation, Norwalk, Conn.

[21] Appl. No.: 565,289

[22] Filed: Aug. 9, 1990

[51] Int. Cl.⁵ .......................................... H01J 37/252
[52] U.S. Cl. ................................. 250/305; 250/309; 250/310; 250/397
[58] Field of Search ............... 250/305, 306, 309, 310, 250/397

[56] References Cited

U.S. PATENT DOCUMENTS

| | | | |
|---|---|---|---|
| 3,609,352 | 9/1971 | Harris | 250/305 |
| 3,699,331 | 10/1972 | Palmberg | 250/305 |
| 3,742,214 | 6/1973 | Helmer et al. | 250/305 |
| 3,805,057 | 4/1974 | Yanagisawa et al. | 250/305 |
| 3,920,990 | 11/1975 | Van Nieuwland et al. | 250/309 |
| 4,100,409 | 7/1978 | Brongersma | 250/305 |
| 4,205,226 | 5/1980 | Gerlach | 250/305 |

OTHER PUBLICATIONS

"A Cylindrical Mirror Photoelectron Spectrometer with Position-Sensitive Detector Used for X-Ray Analysis" by O. Benka, Nuclear Instruments and Methods, 203. 547-550, (1982).

"Microchannel Plate Detectors" by J. L. Wiza, Nuclear Instruments and Methods, 162, 587-601, (1979).

Primary Examiner—Jack I. Berman
Assistant Examiner—Kiet T. Nguyen
Attorney, Agent, or Firm—H. S. Ingham; E. T. Grimes

[57] ABSTRACT

A charged-particle energy analyzer includes a hollow axisymmetrical body with an annular opening therein receptive of input electrons from a cylindrical mirror analyzer, the electrons having a distribution of electron energies and a range of electron trajectories. The trajectories each have a radially inward directional component and an axial directional component in a forward direction parallel to the axis. Annular deflectors with negative potentials are disposed coaxially in the body so as to reverse the axial directional components of the electron trajectories. A ring-shaped channel detector detects the electrons relative to radial distance and thereby to energy.

25 Claims, 4 Drawing Sheets

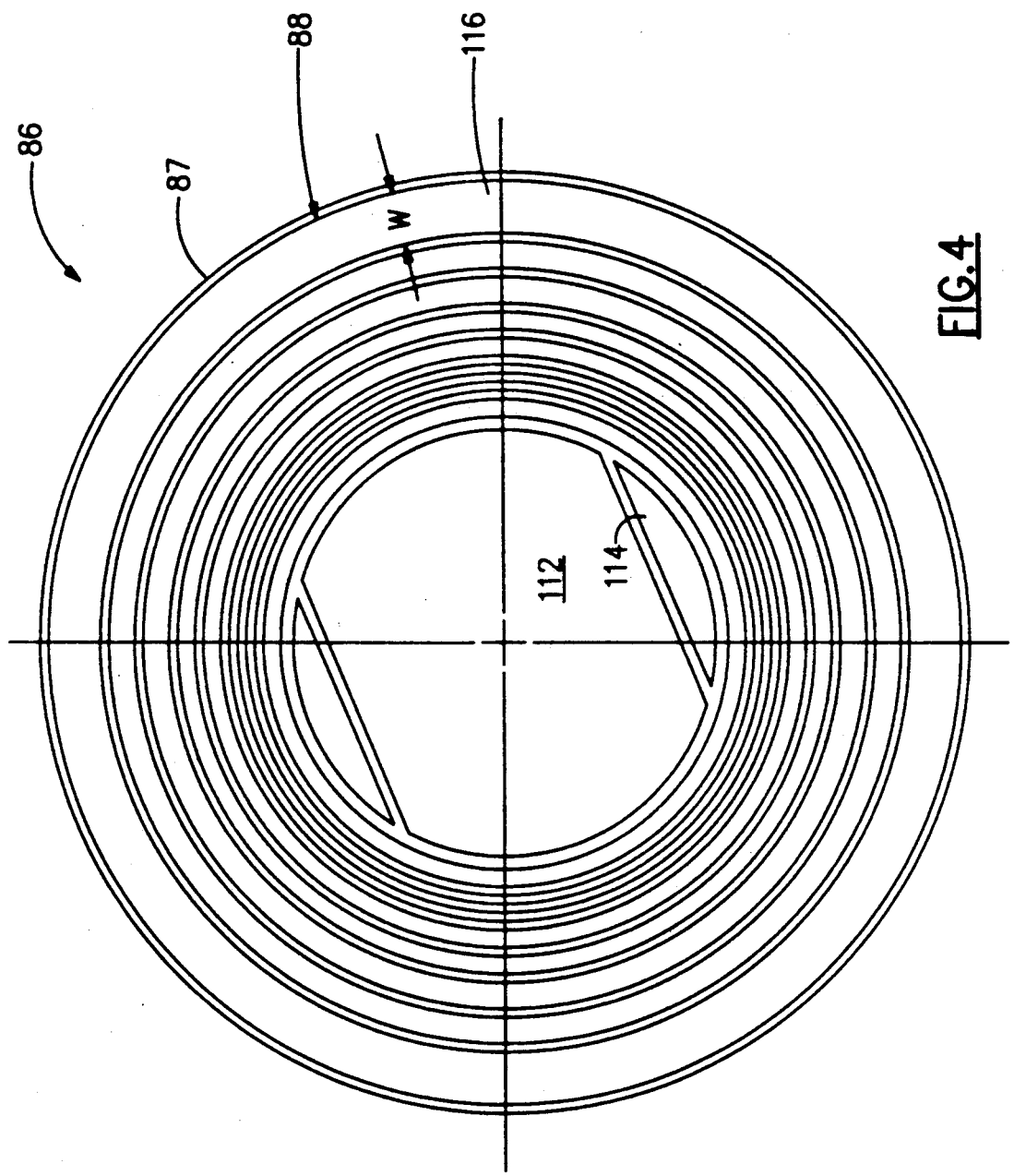

MULTICHANNEL CHARGED-PARTICLE ANALYZER

This invention relates to charged-particle energy analyzing systems generally used for characterizing sample surfaces, and particularly to such a system incorporating an additional multichannel charged particle analyzer.

BACKGROUND OF THE INVENTION

Instrumentation for use in spectroscopy of charged particles makes use of electrons or ions which are emitted from a substance after being bombarded or irradiated with electrons or ions from a source such as an electron gun. A technique to which the invention is particularly directed is known as Auger electron spectroscopy. In this technique, a target sample material is placed in a vacuum, usually below $10^{-7}$ Torr, and upon being bombarded with electrons from some source, such as an electron gun, the sample gives off a variety of emissions. Among these are X-rays, secondary electrons, and reflected primary electrons from the source. The emissions include Auger electrons (a particular class of secondary electrons) in the manner which is well known in the literature.

In the art of Auger electron spectroscopy, as taught for example in U.S. Pat. No. 4,205,226 (Gerlach), of the present assignee, instruments making use of cylindrical mirror analyzers ("CMA") are known which analyze the energy and the energy spectrum of Auger electrons emitted by the sample material. Such instruments operate by injecting the diverging electrons into a radial electric field produced between a pair of coaxially mounted electrode cylinders held at different electric potentials. Auger electrons injected from the sample into the radial electric field between the cylindrical electrodes are deflected by the field back toward the common axis of the electrodes. Electrons of a predetermined energy are thereby brought to a focus. By positioning a collector apparatus at this focus, electrons of a predetermined energy are selected and detected. By sweeping the voltage impressed across the cylindrical electrodes through a range of values, and detecting as a function of these applied potentials such electrons as are collected, the energy spectrum of the injected electrons may be plotted and determined.

As disclosed in the aforementioned patent, it is advantageous to utilize a detector system that is off-axis, for example annular, because the central axis is used for the primary beam to the target. Also, magnetic lenses used for the electron gun deflect paths of electrons being detected, thus interfering with precision measurements. German Patent Application No. 27 05 430 similarly discloses off-axis detection in several configurations and electron paths, representing efforts to increase sensitivity. U.S. Pat. No. 4,100,409 teaches bringing the electron gun beam from off-axis, eliminating magnetic lenses, and then utilizing an on-axis detector system to receive electrons from the cylindrical analyzer.

In an article "A Cylindrical Mirror Photoelectron Spectrometer With Position-Sensitive Detector Used For X-Ray Analysis" by O. Benka, Nuclear Instruments and Methods, 203, 547-550 (1982) there is described a CMA with a position sensitive detector positioned off-axis for multichannel detection of electrons leaving the CMA, to increase instrument sensitivity. The high precision detector useful for such an application is a channel plate detector of the type disclosed in an article "Microchannel Plate Detectors" by J. L. Wiza, Nuclear Instruments and Methods, 162, 587-601 (1979). Such a detector includes a ceramic plate formed with a large number of microchannels therethrough, each microchannel being an electron multiplier of incident electrons or ions.

The channel plate detector is quite effective but, because of its inherent construction, has generally been available commercially as a flat ceramic plate with a planar electron entry surface. Recently curved plate technology has become available on a limited basis but is extremely expensive. Therefore, Benka placed such a channel detector plate in only a small (40 degree) azimuthal portion of the 360 degree CMA. He further utilized a 6 degree polar range (12 degrees is actually more standard), and reported measuring 6.5% of the electron energy spectrum with 0.3% resolution. This result was actually an 18 times decrease in angular acceptance. This could be improved upon by utilizing a ring of such plates, but such an assembly would be a cumbersome and costly solution and still may not provide optimum sensitivity.

SUMMARY OF THE INVENTION

An object of the present invention is to provide a novel charged-particle energy analyzer useful for improving sensitivity of an axi-symmetrical energy analyzing system. Another object is to provide such an analyzer having an axial opening therethrough available for an axially-directed primary energy beam in the system. Further objects are to provide for sensitive off-axis detection of electrons, and to improve signal-to-noise ratio. Yet another object is to provide an improved energy analyzer incorporating a channel plate detector so as to detect substantially a full 360° azimuthal range of particles having a distribution of energies.

The foregoing and other objectives are achieved with a charged particle energy analyzer comprising a hollow axi-symmetrical body with an annular opening therein coaxial to a central axis. The annular opening is receptive of input charged particles from an energy dispersing means such as a cylindrical mirror analyzer. The input particles have a distribution of particle energies and a range of particle trajectories, the trajectories each having a radially inward directional component and an axial directional component in a forward direction parallel to the axis. A deflection means is disposed coaxially in the body so as to be receptive of the input particles for reversing the axial directional component of each of the trajectories, and directing the particles oppositely from the forward direction through an axi-symmetrical entry area such that radial distances of the electrons from the axis at the entry area are associated with the electron energies. A detector means is disposed in the body with an entry surface coinciding with the entry area for detecting the electrons at the entry area relative to radial distance. Such a configuration allows the analyzer to have an axial passage therethrough for a central energy beam directed to a target source of the charged particles.

In a preferred embodiment the deflection means comprises a pair of electrodes. A primary electrode with an annular primary electrode surface is disposed coaxially in the body generally perpendicular to the axis so as to face toward the entry surface, The primary electrode surface has an axi-symmetric concave curvature facing toward the entry surface. A secondary electrode with a secondary electrode surface is disposed coaxially within and in general axial alignment with the primary electrode surface so as to face toward the entry surface. A primary voltage is effected on the primary electrode relative to the detector means being at ground potential, and a secondary voltage is effected on the secondary electrode relative to the detector means. The voltages are positive or negative corresponding respectively to the charged particles being positive or negative. The secondary voltage is less in magnitude than the primary voltage.

Advantageously the detector means is an annular channel plate detector assembly. A channel plate with a matrix of electron multiplier channels is receptive of the charged particles at the planar entry area and passing through to a backside of the channel plate. An anode plate communicates with the channels at the backside and is formed with a plurality of annular anode rings coaxial to the axis so that each anode ring receives electrons from the channel plate according to radial distance of the electrons from the axis.

BRIEF DESCRIPTION OF THE DRAWINGS

FIG. 4 is a face view of an anode plate used in the invention of FIG. 3.

DETAILED DESCRIPTION OF THE INVENTION

Figure 1:
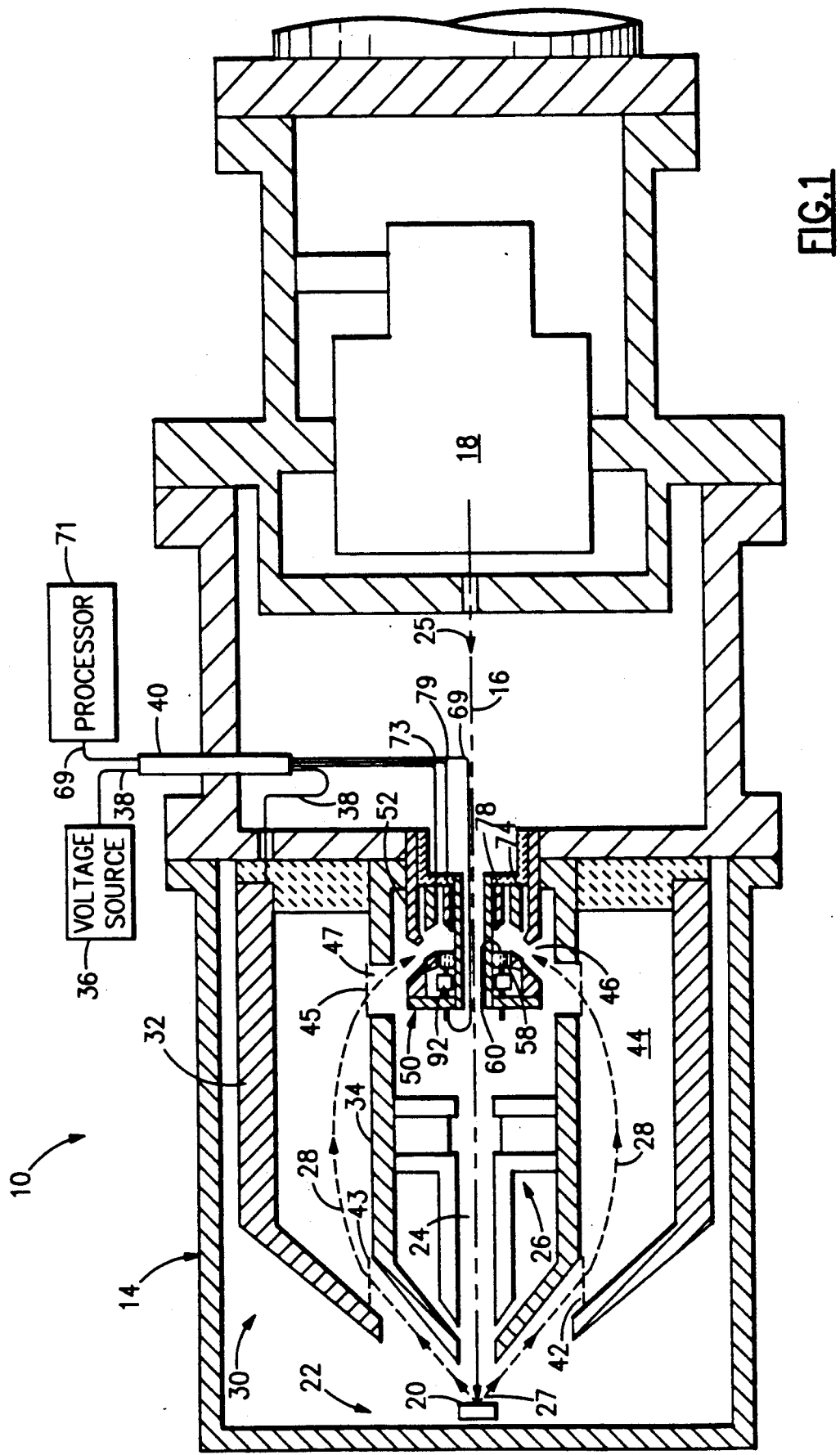
FIG. 1 is a simplified longitudinal section of a cylindrical mirror analyzer system incorporating an electron energy analyzer according to the invention.

An electron energy analyzing system 10 incorporating the invention is shown in FIG. 1. Generally the components except those associated with a detector subassembly are conventional such as in a Model 25-120A Auger electron spectroscopy analyzer sold by The Perkin-Elmer Corporation. This figure is schematic; details may be found in references such as the aforementioned U.S. Pat. No. 4,205,226.

The analyzing system 10 is enclosed in a multi-component housing 14 which is maintained at vacuum by an ion pump, these conventional components being not shown. For clarity other standard parts such as viewing ports, internal valving, sample mount and the like are also not shown. An electron gun 18 located on the axis 16 of the system may be any desired type such as may be based on electrostatic or magnetic optics, or thermionic or field emission of electrons. A target 20 of sample material to be surface analyzed is placed at an outer end 22 of the system. The system is generally cylindrical, and all of the components located between the electron gun and the target have an axial passage 24 extending therethrough so that a primary electron or other energy beam 25 can be directed from the gun 18 onto the target. Electron optical components for the beam, shown generally at 26 may also be disposed coaxially as required, such as a variable aperture objective, steering plates, an objective lens, a deflector and a stigmator, some of which may be magnetic.

The beam from the gun causes charged particles 27 to be emitted from the target. The particles may be positive ions, negative ions or electrons, for example Auger electrons. In other cases the axial beam 25 to the target may be an ion stream, X-rays or any other suitable energy source, and the emission may include reflected electrons.

The present system has two energy analyzers operating in tandem with respect to emitted electrons 27. The first, or primary analyzer is a conventional cylindrical mirror analyzer 30 (CMA). This comprises an outer conductive cylinder 32 and an inner conductive cylinder 34. The outer cylinder has a negative voltage relative to a reference voltage on the inner cylinder, the reference generally being ground potential. Voltages are provided by a DC source 36 via leads 38 in a through-fitting 40 in the housing 14.

Electrons 27 diverging from the target within a certain range of conical angles pass through a first annular gap 42 and a grounded screen 43 and enter the space 44 between the cylinders. Because of the field associated with the negative voltage on the outer cylinder 32, the electrons will follow a path 28 that curves back toward the axis 16 of the system. The exact path or trajectory for each electron is dependent on the kinetic energy of the electron relative to the field. Those electrons with an energy within a small range of energies will exit the space 44 through another grounded screen 45 and an annular passage 47 in the inner cylinder 34, to be detected by a detection system 50 located within the inner cylinder 34 opposite the target source 20.

In the prior analyzer, disclosed in the aforementioned U.S. Pat. No. 4,205,226, a small annular opening is provided for the electron detector. By changing the voltage on the outer cylinder the energy band selected by the detector is changed correspondingly. Thus scanning of the voltage combined with electron detection of electrons transmitting the gap provides a spectrum which may be correlated with characteristics of the target, such as material and topography.

Figure 2:
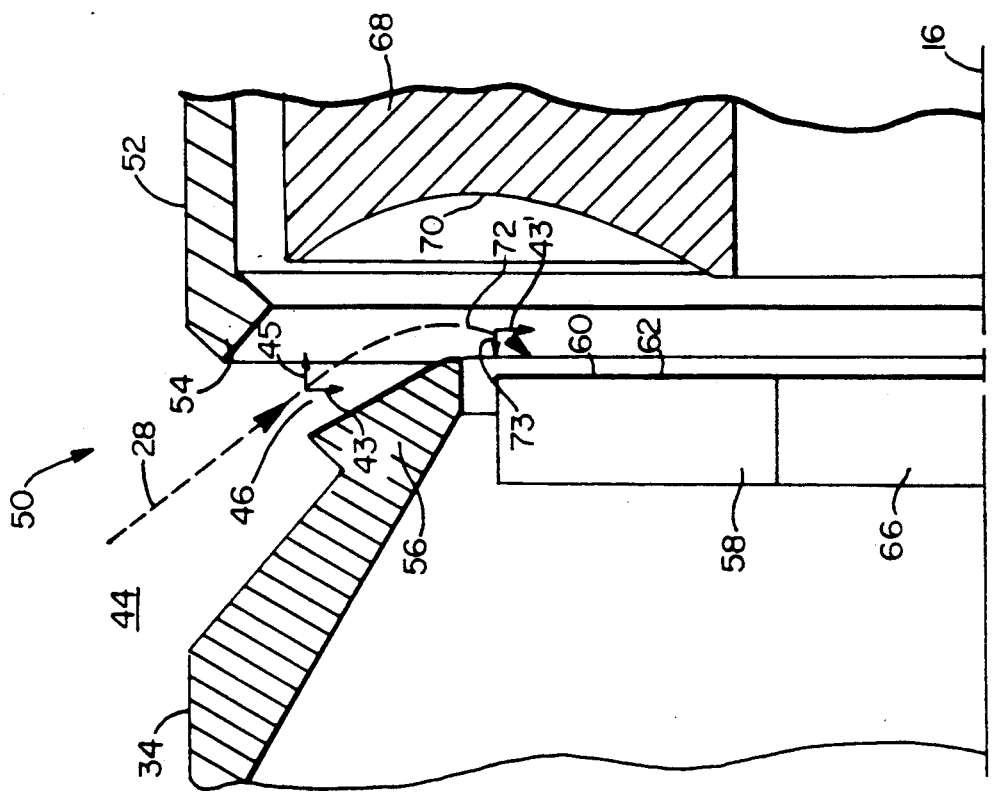
FIG. 2 is a longitudinal half-section of one embodiment of an electron energy analyzer of the invention.

According to the present invention the conventional detection system is replaced by a specific type of second energy analyzer 50, for further measuring the spectrum within the energy range of electrons passing through the passage 47. A simple embodiment of this secondary analyzer 50 is shown schematically in FIG. 2. The components are symmetrical about an axis 16 which coincides with the axis of the system (FIG. 1). A body 52, which may be a portion of the inner cylinder 34 (although not so in the present example), has an annular opening 46 therein.

The opening 46 is bounded by an outer wall 54 and an inner wall 56 of the body 52, so that the opening generally faces outwardly and rearwardly toward input electrons 28 passing from the cylindrical analyzer space 44. At the annular opening 46 each electron has a trajectory 28 with a radially inward directional component 43 and an axial directional component 45 in a forward direction (toward the right in the figures).

A deflector means formed of a deflector electrode 68 with a surface 70 is disposed coaxially in the body 52 generally with the surface perpendicular to the axis 16 so as to face toward the detector 58. In this simple embodiment this electrode may have its surface 70 extending inwardly to approximately the same inner radius as for the detector. Although preferably axi-symmetrically curved as shown, the surface may be flat or conical within the purview of the invention. A negative voltage via line 73 from source 36 (FIG. 1) on this electrode, relative to the body 52 and detector entry surface 60 being at the reference (ground) voltage, deflects the incoming electrons back toward a detector 58 as shown at path location 72. In the case of the charged particles being positive ions, the voltage is positive; thus the voltage is positive or negative corresponding respectively to the charged particles being positive or negative. In either case the axial directional component is reversed to an axial directional component 73 opposite the forward direction. The radial component 43' may also be affected, possibly even reversed. Preferably this voltage has a magnitude corresponding approximately to an average of the electron energies (in election volts) of the input electrons 28.

A channel plate detector assembly 58 is disposed inwardly of the inner wall 56 and has an electron entry surface 60 for the reversed-direction electrons and extends to a radius proximate the inner wall. The detector is washer-shaped with the entry surface 60 coinciding with an entry area 62 that is perpendicular to the axis 16, advantageously radially inward of the annular opening. An axial hole 66 in the detector 58 accommodates the central beam as explained above. The detector signals are sent via leads 69 to a data processor 71 (FIG. 1) for conversion to spectrographic information of energy distribution. This detector is sensitive to the radial position of the reversed electrons. Since such radial position is energy dependent, the position-sensitive detector measures energy distribution of the electrons.

Figure 3:
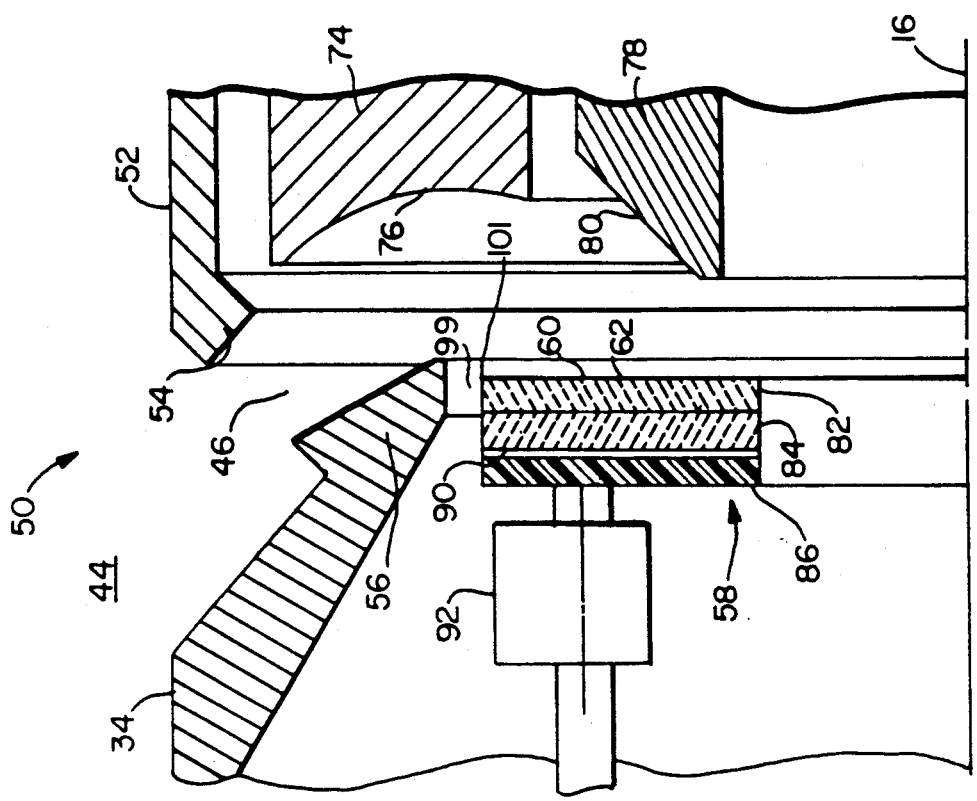
FIG. 3 is a longitudinal half-section of another embodiment of an electron energy analyzer of the invention.

In a preferred embodiment, FIG. 3 (also shown in FIG. 1), the general configuration is similar except that the deflector means comprises two electrodes. A primary electrode 74 has a primary electrode surface 76 with an axi-symmetric concave curvature, or toroidal section, facing back toward the entry surface 60 of the detector means. Via line 73 the voltage means 36 (FIG. 1) provides a negative (positive for positive ions) primary voltage to this electrode to deflect the electrons back to the detector means 58. The curvature of the toroidal section approximates the average curvature of trajectories for deflected electrons which are explained below.

A ring-shaped secondary electrode 78 has a secondary electrode surface 80 disposed coaxially within the primary electrode surface so as to face toward the entry surface 60. The shape of the electrode surface 80 is not critical and conveniently is a frusto-conical surface facing radially outward. This surface has a radial disposition within that of the entry surface, i.e. at about the same radius although axially spaced therefrom. The secondary electrode 78 has a negative (or positive in the case of positive ions) secondary voltage relative to the body and the detector means, the secondary voltage being less in magnitude than the primary voltage, and preferably about half of the primary voltage. This secondary voltage is derived [from the source 36 via a line 79 (FIG. 1).]

The detector 58 is shown in some more detail in this figure with further details of the channel plate detector assembly being essentially as described in the aforementioned article by Wiza. A channel plate available from Galileo Electro-Optics Corp., Sturbridge Massachusetts, as "MCP-28", has channels with 32 micron center-center spacing, each channel being 25 microns ID and one mm thick. The plate is given an annular (ring) shape. The detector comprises at least a single channel plate, and preferably a chevron pair of channel plates 82,84 at opposed 8 degrees each as disclosed in Wiza to block ion back drift. Although ring-shaped, the entry surface 60 is planar, as is typical of a channel plate surface.

An anode plate 86 of an insulating base 87 with a plurality of annular anode rings (collectively designated 88 in FIG. 4) is placed behind the channel plates to receive the multiplied electron flow. With the electron entry surface 60 at reference (ground) potential, the voltages between plates is, e.g., +1000 V, voltage on the backside 90 is +2000 V, and the voltage on the anode plate rings is +2200 V. Measurement of electrons cascaded from the input electrons or ions is made conventionally either by current flow with analog detection or by electron counts with digital detection. FIG. 3 illustrates a system for digital detection using a set of arcuately spaced capacitors (one shown at 92) of 200 picofarads each leading from a different anode ring through connection leads 69 (FIG. 1) to an electronic amplifier-processor 71 with display or other presentation of data.

Figure 5:
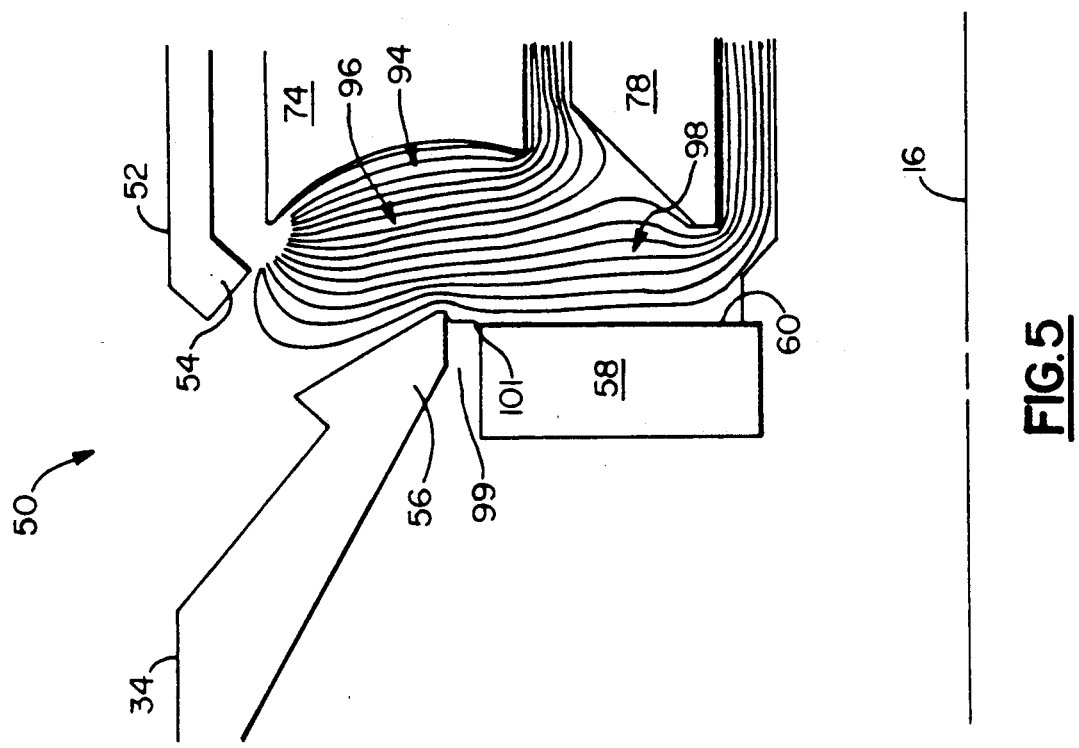
FIG. 5 shows computer-generated electrical field lines associated with the embodiment of FIG. 3.

FIG. 5 shows computer-generated equipotential field lines 94 associated with the illustrated configuration, a primary electrode voltage of −1535 volts, and a secondary electrode voltage of −767.5 volts. The lines may be seen to be denser in the region 96 between the detector surface 60 and the primary electrode 74 than in the region 98 between the detector surface and the secondary electrode 78. This effect is believed to contribute to the beneficial results achieved with this configuration, described below.

In order to minimize influence of any electrical field in the gap 99 between the inner wall 56 and the detector 58, the spacial separation of the outer edge 101 of the entry surface 60 should be relatively small. More specifically this separation should be substantially less than the spacial separation of the entry surface from the primary electrode surface 76, preferably less than about one quarter of the latter separation. As previously indicated, the body including wall 56 and the surface 60 should both be at ground potential.

Figure 6:
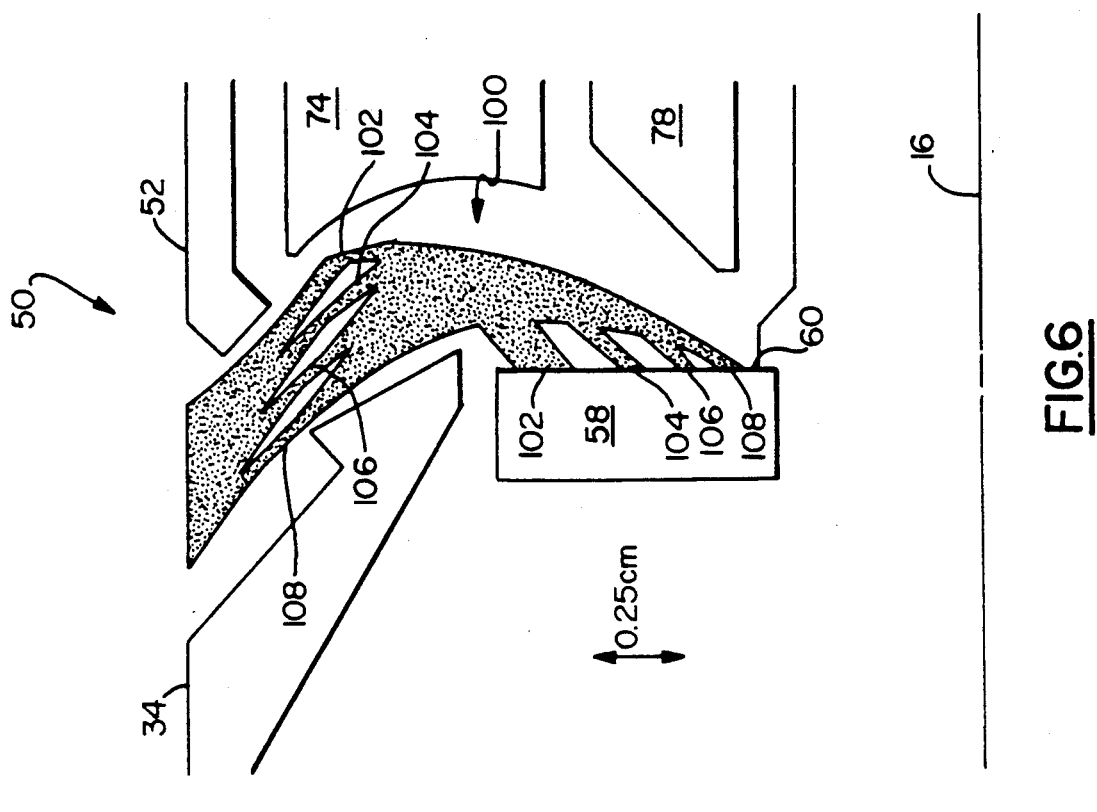
FIG. 6 shows computer-generated electron trajectories associated with the embodiment of FIG. 3.

FIG. 6 shows computer-generated electron trajectories 100 through the field shown in FIG. 5. The trajectories were initiated at the center of the target surface with polar angles at the target from 35.2 to 47.2 degrees and with four energies from 1520 eV to 1548 eV in 9 1/3 eV increments. These trajectories are shown in fully darkened patterns of four bundles, 102,104,106,108, one for each energy, with zero energy band width. The trajectories were traced through a cylindrical analyzer with a 16.25 cm diameter outer cylinder, 7.5 cm diameter inner cylinder, and −1000 V applied to the outer cylinder. The target surface 20 was 18.7 cm from the detector surface 60 (FIG. 1). The scale of the secondary analyzer is shown in the FIG. 6. The inner cylinder, the second analyzer body and the input surface of the channel detector were electrically grounded. The primary and secondary deflection electrodes 74,78 had applied potentials of −1535 V and −767.5 V respectively, for the computer-generated paths.

Focus, or crossover, of the electrons from the CMA is substantially at the annular opening and in a conical surface at the conventional 23 degree angle to the axis. Particles with the highest kinetic energy trajectories 102 penetrate the farthest into the deflecting field and lose the most energy because of the deep penetration. These are deflected the most and strike the channel plate near its outer radius. Conversely, the lowest energy particles 108 penetrate the least and lose the least amount of energy, and travel to the channel plate nearest the axis. There is also a focusing effect of the medium and lower energy electrons 104,106,108.

The energy dispersion across the channel plate detector 58 is generally nonlinear. This is readily compensated by selected radial positions of the annular rings 88 on the anode plate, as shown in FIG. 4 for eight rings. The rings are connected electrically through to a conductive pattern (not shown) on the backside of the plate with appropriate resistors to the DC source to bias the anodes. For pulse counting the capacitors 92 couple the signals to amplifiers (incorporated in processor 71, FIG. 1) at near ground potential. Central hole 112 is for mounting and the axial channel 24 (FIG. 1). Conductive area 114 is raised to contact the second channel plate backside 90 for application of the appropriate voltage.

The distribution of electron energies may be defined as a set of energy bands each having an energy band width, and the radial distances of the electrons at the plane may be organized as a set of annular channels each corresponding to an energy band and having a correspondingly selected radial width. Each annular ring 88 of the anode plate then has a different ring width W (shown only for outer ring 116) corresponding to a selected radial width of a corresponding annular channel and thereby to a corresponding energy band. This results in detection channels that have approximately equal energy resolution.

The expected performance of such a multichannel analyzer can be estimated from and compared with that of a single channel CMA operated at 0.3% energy resolution and with the same angular acceptance. The single channel CMA count rate under standard Auger measurement conditions is about 100 kcps (thousand counts per second) above background. Given 8 energy channels in the present multichannel CMA system with a secondary analyzer, and a 60% channel plate efficiency (compared to single channel detection), the multichannel CMA count rate will be about 8*100*60%=500 kpcs above background with the same 0.3% energy resolution.

Also, there is significant background noise in a conventional CMA due to scattering in the analyzer to the annular opening at the focal plane. The secondary analyzer effectively screens out a large portion of the scattered electrons outside of the energy range established for the analyzer. This results in a significant increase in signal-to-background ratio.

Although described herein for a CMA, the present invention should be suitable with other axi-symmetrical configurations for the primary electron energy analyzer. An example is an analyzer with inner and outer curved conductors in place of the cylindrical conductors. Also, the system need not have the full 360 degree azimuthal or cylindrical configuration and, for example may be hemicylindrical. As used herein and in the claims, the terms axi-symmetrical, annular and the like as related to the axi-symmetry of the system and its analyzer, deflection and detector components, are intended to include such partially cylindrical configurations, since it will be appreciated that the principles of operation are the same.

While the invention has been described above in detail with reference to specific embodiments, various changes and modifications which fall within the spirit of the invention and scope of the appended claims will become apparent to those skilled in this art. Therefore, the invention is intended only to be limited by the appended claims or their equivalents.

What is claimed is:

1. A charged particle energy analyzer comprising:
a hollow axi-symmetrical body with an annular opening therein coaxial to a central axis, the annular opening being receptive of input charged particles having a distribution of particle energies and a range of particle trajectories, the trajectories each having a radially inward directional component and an axial directional component in a forward direction parallel to the axis;
deflection means disposed coaxially in the body so as to be receptive of the input charged particles for reversing axial directional components of the trajectories and directing the charged particles oppositely from the forward direction through an axi-symmetrical entry area such that radial distances of the charged particles from the axis at the entry area are associated with the particle energies; and
detector means with an entry surface coinciding with the entry area for detecting the charged particles at the entry area relative to radial distance.

2. The analyzer according to claim 1 wherein the entry surface is disposed radially inward of the annular opening.

3. The analyzer according to claim 1 wherein the deflection means comprises a primary electrode disposed coaxially in the body with a primary electrode surface generally perpendicular to the axis so as to face toward the entry surface, and further comprises voltage means for effecting a primary voltage on the primary electrode relative to the detector means, the primary voltage being positive or negative corresponding respectively to the charged particles being positive or negative.

4. The analyzer according to claim 3 wherein the primary voltage has a magnitude corresponding approximately to an average of the particle energies.

5. The analyzer according to claim 3 wherein the primary electrode surface has an axi-symmetric concave curvature facing toward the entry surface.

6. The analyzer according to claim 5 wherein the primary electrode is annular, the deflection means further comprises a secondary electrode with a secondary electrode surface disposed coaxially within and in general axial alignment with the primary electrode surface so as to face toward the entry surface, and the voltage means further effects a secondary voltage on the secondary electrode relative to the body and the detector means, the secondary voltage being less in magnitude than the primary voltage and being positive or negative corresponding respectively to the primary voltage being positive or negative.

7. The analyzer according to claim 6 wherein the secondary voltage is about half of the primary voltage.

8. The analyzer according to claim 6 wherein the secondary electrode surface is a frusto-conical surface facing radially outward toward the detector means.

9. The analyzer according to claim 3 wherein the annular opening is bounded on one side by an outer wall of the body and on the opposite side by an inner wall of the body disposed radially inward of the outer wall, the entry surface has an outer edge with a first spacial separation radially inward from the inner wall and a second spacial separation from the primary electrode surface, the first spacial separation is substantially less than the second spacial separation, and the voltage means effects a reference voltage in common to both the entry surface and the body.

10. The analyzer according to claim 9 wherein the first spacial separation is less than about one quarter of the second spacial separation.

11. The analyzer according to claim 1 wherein the entry surface is planar.

12. The analyzer according to claim 11 wherein the detector means is a channel plate detector assembly.

13. The analyzer according to claim 12 wherein the channel plate detector assembly comprises an annular channel plate with a matrix of electron multiplier channels receptive of the charged particles at the entry area and passing through to a backside of the channel plate, and further comprises an anode plate communicating with the channels at the backside, the anode plate being formed with a plurality of annular anode rings coaxial to the axis so that each anode ring receives electrons from the channel plate according to radial distance of the charged particles from the axis.

14. The analyzer according to claim 13 wherein the distribution of particle energies comprises a set of energy bands each having an energy band width, the radial distances of the electrons at the entry surface are organized as a set of annular channels each associated with an energy band and having a corresponding radial width, and each anode ring has a ring width associated with a radial width of a corresponding annular channel and is thereby associated with a corresponding energy band.

15. The analyzer according to claim 14 wherein the energy band widths are substantially equal.

16. The analyzer according to claim 1 wherein the analyzer has an axial passage therethrough.

17. The analyzer according to claim 1 further comprising particle energy dispersement means for effecting the input charged particles to the annular opening.

18. The analyzer according to claim 17 wherein the dispersement means focuses input charged particles substantially at the annular opening spacially according to particle energy.

19. The analyzer according to claim 18 wherein the dispersement means comprises a cylindrical mirror analyzer.

20. The analyzer according to claim 19 wherein the charged particle energy analyzer has an axial passage therethrough and further comprises target means for retaining a target source on the central axis for emitting charged particles into the dispersement means, and beam generating means for directing an energy beam through the axial passage to the target source so as to effect emitting of the charged particles from the target source.

21. The analyzer according to claim 1 wherein the charged particles are electrons.

22. An electron energy analyzer comprising:
a hollow axi-symmetrical body with an annular opening therein coaxial to a central axis, the annular opening being receptive of input electrons having a distribution of electron energies and a range of electron trajectories, the trajectories each having a radially inward directional component and an axial directional component in a forward direction parallel to the axis;
deflection means disposed coaxially in the body so as to reverse the axial directional components of the electron trajectories and direct the electrons oppositely from the forward direction through an axi-symmetric planar entry area such that radial distances of the electrons from the axis at the entry area are associated with the electron energies; and
a channel plate detector assembly disposed in the body and having a planar entry surface coinciding with the entry area for detecting the electrons at the entry area relative to radial distance, the channel plate detector having an axial passage therethrough;
the deflection means comprising a primary electrode with an axial opening therethrough and having an axi-symmetric concave surface disposed coaxially in the body generally perpendicular to the axis so as to face toward the entry surface, a secondary electrode with a central passage therethrough and a frusto-conical surface disposed coaxially within and in general axial alignment with the primary electrode surface so as to face radially outward toward the entry surface, and voltage means for effecting a negative primary voltage on the primary electrode and a negative secondary voltage on the secondary electrode, the primary and secondary voltages each being relative to the body and the entry surface, and the secondary voltage being less in magnitude than the primary voltage.

23. The analyzer according to claim 22 wherein the annular opening is bounded on one side by an outer wall of the body and on the opposite side by an inner wall of the body disposed radially inward of the outer wall, the entry surface has an outer edge with a first spacial separation radially inward from the inner wall and a second spacial separation from the primary electrode surface, the first spacial separation is substantially less than the second spacial separation, and the voltage means effects a reference voltage in common to both the entry surface and the body.

24. The analyzer according to claim 22 wherein the channel plate detector assembly comprises a channel plate with a matrix of electron multiplier channels receptive of the electrons at the plane and passing through to a backside of the channel plate, and further comprises an anode plate communicating with the channels at the backside, the anode plate being formed with a plurality of annular anode rings coaxial to the axis so that each anode ring receives electrons from the channel plate according to radial distance of the electrons from the axis, and wherein the distribution of electron energies comprises a set of energy bands each having an energy band width, the radial distances of the electrons at the entry surface are organized as a set of annular channels each associated with an energy band and having a corresponding radial width, and each anode ring has a ring width associated with radial width of a corresponding annular channel and is thereby associated with a corresponding energy band.

25. The analyzer according to claim 22 wherein the analyzer has a central passage therethrough and further comprises beam generating means for directing an energy beam through the axial passage to a target source so as to effect electron emission therefrom, and a cylindrical mirror analyzer receptive of the electron emission for effecting the input electrons and focusing the same at the annular opening spacially according to electron energy.

* * * * *